United States Patent
Meeus et al.

(10) Patent No.: US 7,749,883 B2
(45) Date of Patent: Jul. 6, 2010

(54) ELECTROFORMED STENCILS FOR SOLAR CELL FRONT SIDE METALLIZATION

(75) Inventors: Thomas Meeus, Retie (BE); Hans Korsse, Breda (NL); Ravindra M. Bhatkal, East Brunswick, NJ (US)

(73) Assignee: Fry's Metals, Inc., South Plainfield, NJ (US)

( * ) Notice: Subject to any disclaimer, the term of this patent is extended or adjusted under 35 U.S.C. 154(b) by 0 days.

(21) Appl. No.: 12/201,654

(22) Filed: Aug. 29, 2008

(65) Prior Publication Data
US 2009/0081823 A1  Mar. 26, 2009

Related U.S. Application Data

(60) Provisional application No. 60/973,957, filed on Sep. 20, 2007.

(51) Int. Cl.
*H01L 21/02* (2006.01)
(52) U.S. Cl. .................. 438/597; 257/E21.002
(58) Field of Classification Search ............... 427/98.4; 430/308; 438/597; 257/E21.002
See application file for complete search history.

(56) References Cited

U.S. PATENT DOCUMENTS

| | | | |
|---|---|---|---|
| 4,264,714 A | | 4/1981 | Trausch |
| 4,602,120 A | * | 7/1986 | Wakefield et al. ............ 136/256 |
| 5,268,039 A | * | 12/1993 | Vogeli et al. ................. 136/256 |
| 5,804,248 A | * | 9/1998 | Hewett ....................... 427/97.2 |
| 5,878,661 A | | 3/1999 | Glovatsky et al. |
| 6,095,041 A | | 8/2000 | Comino et al. |
| 6,988,652 B2 | * | 1/2006 | Fleck et al. ............. 228/180.21 |
| 2003/0222125 A1 | | 12/2003 | Fleck et al. |

FOREIGN PATENT DOCUMENTS

| | | |
|---|---|---|
| DE | 28 28 625 B1 | 9/1979 |
| DE | 197 26 689 A1 | 1/1999 |
| FR | 2 337 358 | 7/1977 |
| WO | 93/18440 | 9/1993 |

OTHER PUBLICATIONS

De Moor et al., "Printing High and Fine Metal Lines Using Stencils," Jun. 30, 1997, 4 pps.
Hoornstra et al., "The Importance of Paste Rheology In Improving Fine Line, Thick Film Screen Printing of Front Side Metallization," Jun. 30, 1997, 4 pps.
International Search Report for PCT/US2008/075622 mailed Jan. 26, 2009.

* cited by examiner

*Primary Examiner*—W. David Coleman
*Assistant Examiner*—Daniel Shook
(74) *Attorney, Agent, or Firm*—Lando & Anastasi (57) ABSTRACT

A method for providing metallization upon a semiconductor substrate utilizing a stencil having at least one aperture extending from the contact side to the fill side, the contact side of the stencil being substantially flat and forming a sharp edge with a wall of the at least one aperture, the at least one aperture being tapered such that an area of a cross-section of the at least one aperture at the fill side is larger than an area of the cross-section of the at least one aperture at the contact side. A method of forming a stencil for depositing metallization lines on a semiconductor substrate is also disclosed.

31 Claims, 10 Drawing Sheets

ELECTROFORMED STENCILS FOR SOLAR CELL FRONT SIDE METALLIZATION

RELATED APPLICATION

This application claims priority under 35 U.S.C. §119(e) to U.S. Provisional Application Ser. No. 60/973,957, entitled "ELECTROFORMED STENCILS FOR SOLAR CELL FRONT SIDE METALLIZATION," filed on Sep. 20, 2007, which is herein incorporated by reference in its entirety for all purposes.

BACKGROUND OF INVENTION

1. Field of Invention

The current disclosure is directed to apparatus and methods of printing features on substrates, such as conductive features on semiconductor substrates, and more specifically, to the printing of metallization contact lines on the surfaces of photovoltaic devices, as well as to methods for forming stencils for performing semiconductor metallization processes.

2. Discussion of Related Art

In solar cells, front side metallization allows charge built up on a front surface of a solar cell during use to be transported away from the cell and used to provide electrical power. This front side metallization is deposited on the surface of a solar cell as part of the manufacturing of the solar cell. One methodology for deposition of the front side metallization may employ screen printing techniques to deposit conductive metallization ink onto the surface of the solar cell. Specifically, in certain methods, a conductive metallization ink may be deposited on a substrate through a screen having a pattern defined by openings provided in the screen. A screen utilized for this application may consist, for example, of a 400 mesh polyester or stainless steel carrier with an emulsion image for printing.

There are several well-known difficulties associated with printing conductive metallization ink with a screen printer onto an electronic substrate or solar cell. For example, the metallization ink flow may be obstructed by the carrier mesh. Another difficulty may be the loss of line definition and resultant ragged edges caused by the mesh, which deteriorates over time because of the wear of the emulsion screen. Yet another difficulty is the screen printer's inability to print small line widths due to bleeding of the metallization ink at the contact interface between the screen and the substrate. A further difficulty is the screen printer's inability to print high aspect ratio features because of bleeding of the metallization ink at the contact interface between the screen and the substrate or because of slumping of the ink, leading to widened and topped-off lines.

One possible solution to most of these difficulties might be to increase the viscosity of the metallization ink. However, changing the rheology of the metallization ink to a more viscous type does not adequately solve these problems as the screen may clog very easily when a more viscous ink is used.

Stencils are used in the electronics assembly industry for printing solder paste on electronic circuit boards (also known as printed circuit boards (PCBs) or printed wiring boards (PWBs)) in order to facilitate the attachment of electronic components via a process known as surface mount technology. (See, for example, U.S. Pat. No. 6,988,652, "SOLDER PRINTING USING A STENCIL HAVING A REVERSE-TAPERED APERTURE" to Fleck et al., describing a stencil used for printing solder paste on a contact pad of a printed wiring board.) However, most stencils, such as those used in the electronics assembly industry, typically exhibit significant bleeding and subsequent line broadening and irregularity when used to deposit metallization ink, or other less viscous materials, on semiconductor substrates, making them generally unsuitable for such an application.

The production of flat or three dimensional metal parts, such as stencils, by electroforming on mandrels, is known in the industry. For many two dimensional parts, photoresist technology may be used to prepare the mandrel, typically consisting of a conductive base plate with an image formed by photoresist adhered to it. In known methods for imaging, a mask, such as a plotted silverfilm mask, may be brought in intimate contact with the photosensitive plate to ensure a 1:1 reproduction of the image. When imaging thick photoresist layers, e.g., 100 micrometers, through a mask by a collimated light source, such as a Tamarack 161 collimated exposure system, the resist structure typically shows a tapered form with an angle of about 6 degrees, with the top of the image being smaller than the bottom, thereby limiting the resolution of narrow lines.

Using special, and somewhat complicated techniques, some modeling of a shape of an aperture that may be formed by photoresist technology may be achieved. For instance, in patent application DE 2828625 by Siemens, the following technique is discussed: rotating a light source, mounted under an angle, about an axis perpendicular to a photoresist covered plate. This rotation produces a controllable, circular, symmetric angle of taper in the exposed photoresist.

SUMMARY OF INVENTION

Disclosed are methods for providing metallization upon a semiconductor substrate and for forming a stencil for semiconductor metallization. Some methods according to this disclosure may comprise providing a semiconductor substrate having a surface suitable for printing, placing a stencil having a contact side, a fill side, and at least one aperture extending from the contact side to the fill side over the semiconductor substrate with the contact side of the stencil in contact with the semiconductor substrate, the contact side of the stencil being substantially flat and forming a sharp edge with a wall of the at least one aperture, a cross-section of the at least one aperture at the contact side having a predetermined width, and the at least one aperture being tapered such that an area of a cross-section of the at least one aperture at the fill side is larger than an area of the cross-section of the at least one aperture at the contact side, and printing conductive ink through the at least one aperture and onto the semiconductor substrate. Some methods may further comprise aligning the stencil with the semiconductor substrate.

The semiconductor substrate may comprise silicon and the surface of the semiconductor substrate may comprise a surface of a photovoltaic device. Other materials suitable for use as photovoltaic devices may also be employed.

In a certain embodiment, the conductive ink may comprise a silver-based ink and may have a Malcom viscosity of less than about Mx 30, which corresponds to a viscosity of about 300 pascal-seconds (Pa·s) tested at 10 RPM at 25° Celsius in a Malcom viscometer. In some methods, the conductive ink may have a Malcom viscosity of less than about Mx 15, which corresponds to a viscosity of about 150 Pa·s tested at 10 RPM at 25° Celsius in a Malcom viscometer, and in other methods, from about Mx 05 to about Mx 10, which corresponds to a viscosity of about 50 to about 100 Pa·s tested at 10 RPM at 25° Celsius in a Malcom viscometer, respectively.

In some methods, the conductive ink may have a viscosity of between about 110 and about 140 Pa·s as measured on a Brookfield model HBT cone/plate viscometer tested at 9.6 reciprocal seconds using a 1.565" cone at 25° Celsius. In further methods, the conductive ink may have a viscosity of between about 70 and about 140 Pa·s as measured on a Brookfield model HBT cone/plate viscometer tested at 9.6 reciprocal seconds using a 1.565" cone at 25° Celsius. In some methods, the conductive ink may have a viscosity of between about 70 and about 110 Pa·s as measured on a Brookfield model HBT cone/plate viscometer tested at 9.6 reciprocal seconds using a 1.565" cone at 25° Celsius, and in some methods a viscosity of between about 90 and about 130 Pa·s as measured on a Brookfield model HBT cone/plate viscometer tested at 9.6 reciprocal seconds using a 1.565" cone at 80° Celsius.

In further methods, the conductive ink may have a viscosity of between about 160 and about 260 Pa·s as measured on a Brookfield HBT viscometer (Utility Cup and Spindle) tested at 10 RPM at 25° Celsius.

In some methods, according to this disclosure, the conductive ink may have a resistivity of less than about $15 \times 10^{-6}$ ohm·cm at room temperature. In some methods, the conductive ink may have a resistivity of from about $1.6 \times 10^{-6}$ to about $10 \times 10^{-6}$ ohm·cm at room temperature. In some methods, the conductive ink may have a resistivity in the range from about $2 \times 10^{-6}$ to about $8 \times 10^{-6}$ ohm·cm at room temperature.

One or more methods according to the present disclosure may further comprise removing the stencil, while leaving the conductive ink substantially adhered to the semiconductor substrate. The conductive ink may adhere to the semiconductor substrate without significant bleedout, such that at least one line of conductive ink deposited on the semiconductor substrate has substantially straight edges.

The method disclosed may further comprise heating at least one line of conductive ink after printing, wherein a secure mechanical and electrical coupling between at least one line of conductive ink and the semiconductor substrate is formed.

The method disclosed may involve the formation of features such that a height to width aspect ratio of at least one line of conductive ink is greater than about 1:10 after heating and cooling.

According to some methods, the conductive ink is at about room temperature when passing through the stencil and in some methods the conductive ink is at about room temperature when the stencil is removed.

The method disclosed may include providing or utilizing a stencil including at least one aperture wherein the at least one aperture gradually tapers from the fill side to the contact side of the stencil.

The method disclosed may comprise forcing the conductive ink through the at least one aperture and onto the semiconductor substrate with a squeegee and/or a material dispensing head.

Some methods may include providing or utilizing a stencil having a thickness in the range from about 0.005 mm to about 0.2 mm thick. The stencil may have at least one aperture having a width of between about 0.005 mm to about 0.15 mm at the contact side of the stencil.

The method disclosed may further comprise applying a second stencil to at least a portion of the fill side of the stencil.

In some methods, a conductive finger and a conductive busbar may be deposited on the semiconductor substrate in one print step, a length dimension of the conductive busbar being non-parallel to a length dimension of the conductive finger, the conductive busbar having at least one of a greater thickness and a greater height than the conductive finger.

Further disclosed herein is a method of forming a stencil for semiconductor metallization comprising providing a photosensitive plate including a base plate and a layer of photoresist, the layer of photoresist being between approximately 50 micrometers and 150 micrometers thick, applying an optical separator above the photosensitive plate, the optical separator being transparent to ultraviolet light and having a thickness of between ten micrometers and one millimeter, applying a photolithography mask above the optical separator, passing ultraviolet light through the photolithography mask and optical separator and onto the photosensitive plate, whereby an image characterized by a taper is formed in the layer of photoresist by cross-linking of the photoresist exposed to the ultraviolet light through the photolithography mask and optical separator, removing non-exposed photoresist from the photosensitive plate, forming a stencil on the base plate by electroforming, and removing the stencil from the base plate. The stencil formed exhibits exceptionally flat bottom surfaces and exceptionally sharp edges at a corner of a bottom of a wall of an aperture formed in the stencil such that a stencil is capable of printing conductive ink onto a semiconductor substrate without significant bleedout.

A further method of forming a stencil for semiconductor metallization may comprise laser cutting at least one aperture into a stencil substrate. In one embodiment, the at least one aperture extends from a contact side to a fill side of the stencil substrate, and is tapered such that an area of a cross-section of the at least one aperture at the fill side is larger than an area of the cross-section of the at least one aperture at the contact side. The stencil is formed to exhibit exceptionally flat bottom surfaces and exceptionally sharp edges at a corner of a bottom of a wall of the at least one aperture formed in the stencil such that a stencil is capable of printing conductive ink onto a semiconductor substrate without significant bleedout.

The method may further comprise forming a double layer stencil by joining at least a portion of a contact side of a second stencil substrate comprising at least one laser-cut aperture to at least a portion of the fill side of a first stencil substrate. The method may further comprise aligning an opening of the at least one laser-cut aperture of the second stencil substrate at least partially with an opening of the at least one aperture of the first stencil substrate.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

A solar cell is typically formed of a semiconductor material such as silicon. In operation, when exposed to light, charge builds up on the surfaces of the solar cell and is collected in order to provide useful electric power. A layer of metallization can be applied to a back side of the solar cell to collect charge from the back side. This back side metallization may cover the entire back surface of the cell. In certain embodiments, metallization applied to the front side may cover a small portion of the front surface of the cell to allow a significant amount of light enter the bulk of the cell and produce electric charge.

Metallization may be applied in the form of a conductive ink, such as an ink containing conductive silver particles. This ink may be printed onto a semiconductor substrate in predetermined areas by using a stencil to form metallization lines. The stencil may contain one or more apertures which define the shape of metallization lines to be printed on the substrate. The stencil may be placed in contact and aligned with the substrate. Conductive ink may be printed through at least one aperture in the stencil and onto the substrate by forcing the conductive ink through the aperture using a squeegee, a metal blade or blades, a dispensing head, or another similar device. After printing, the conductive ink may adhere to the substrate and the stencil may be removed, leaving metallization lines on the substrate. The substrate may be further treated, for example, by heating or by coating the substrate with a sealant, to fix or otherwise secure the metallization lines in place.

The terms conductive ink, metallization ink, and conductive paste are used interchangeably in this disclosure. The conductive ink or metallization ink may comprise a number of different materials including silver-based conductive inks such as Solamet™, available from DuPont Microelectronic Materials, of 14 T. W. Alexander Dr., Research Triangle Park, N.C., Solus 6400, available from Cermet Materials, Inc., of 6 Meco Drive, Wilmington, Del., and any of a number of conductive inks available from W. C. Heraeus GmbH of Heraeusstr 12-14, 63450 Hanau, Germany or Ferro Corp. of 1000 Lakeside Avenue, Cleveland, Ohio. Other substances that may be utilized as conductive ink in accordance with one or more embodiments of the present disclosure include conductive polymers, carbon-based inks or pastes, non-silver metallic-based inks, or any other conductive ink or paste known to those skilled in the art.

In some embodiments these conductive inks will have viscosities lower than that of conventional solder pastes. For example, some conductive inks which may be utilized with the disclosed stencils for forming metallization lines may have Malcolm viscosities of less than about Mx 30. Other conductive inks which may be utilized with the disclosed stencils for forming metallization lines may have Malcolm viscosities of less than about Mx 15 or viscosities in a range from about Mx 05 to about Mx 10. Additional conductive inks which may be utilized with the disclosed stencils for forming metallization lines may have viscosities of less than about 140 Pa·s or viscosities in a range of between about 70 Pa·s and about 110 Pa·s as measured on a Brookfield model HBT cone/plate viscometer tested at 9.6 reciprocal seconds using a 1.565" cone at 25° Celsius.

The formation of thin, well-defined metallization lines may be facilitated by the use of stencils with reverse tapered apertures and flat contact surfaces. The use of such stencils may allow superior line formation by reducing bleedout of the conductive ink at the contact interface between the stencil and the substrate and also by reduce slumping of the ink. Metallization lines with superior height to width aspect ratios may be obtained through the use of the stencils disclosed herein.

The methods described herein include the utilization of a stencil having at least one aperture extending from a fill side to a contact side of the stencil and characterized in that the taper of the aperture is reversed from that of the conventional acute taper. Specifically, the aperture is smaller in area at the contact side than at the fill side. Such a stencil is placed in contact with a semiconductor substrate. Conductive ink is then printed, through the aperture, from the fill side of the stencil to the contact side of the stencil, onto the substrate. The conductive ink adheres to the substrate, and the stencil can be removed. The stencil is particularly characterized in that it contains at least one aperture which is reverse tapered such that at least one cross-sectional dimension of the aperture reduces from the fill side to the contact side.

The stencil may be made of metal or other material formed by lasercutting, photoetching, electroforming, combinations thereof, or any other similar method. The production method of fabricating the stencil may have the capability of forming tapered apertures with sharp edges, with the side of the stencil with the smaller side of the aperture (the contact side) being substantially flat. In most embodiments, it is the side of the aperture with the opening having the smaller cross-sectional area that comes in contact with a substrate during printing.

These methods can provide high resolution and high aspect ratios in a pattern of conductive ink or metallization paste that may be deposited onto a semiconductor substrate, as well as provide the ability to print very narrow lines.

Figure 1:
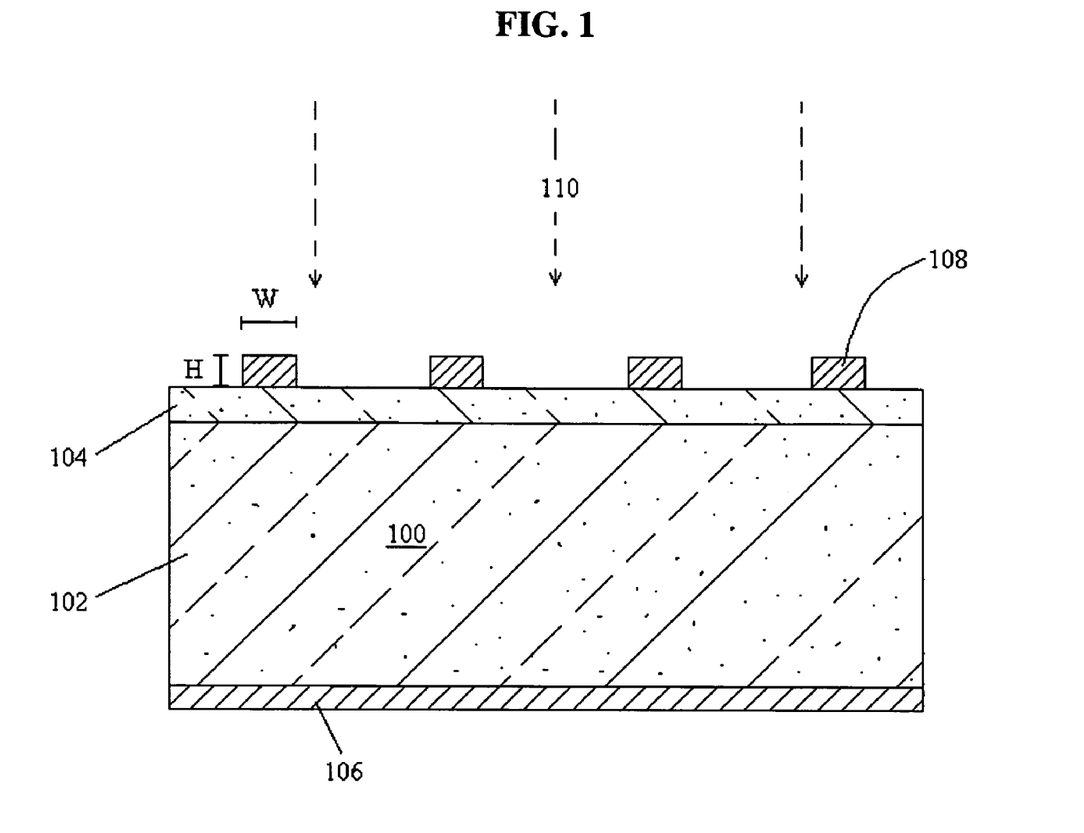
FIG. 1 is a cross section of a portion of a solar cell according to an embodiment disclosed herein.

Turning now to the drawing figures, FIG. 1 illustrates a cross section of a portion of a solar cell that may be formed by methods of embodiments of this disclosure. The solar cell may comprise a substrate 100 with regions of negatively doped silicon 102 and positively doped silicon 104, although the material or materials from which substrate 100 is formed is not limited to silicon, and can be any of a number of materials known in the art for forming photovoltaic cells. Methods for providing semiconductor substrates with levels of doping appropriate for various applications, such as solar cells, are well known in the art. In some embodiments, the doping may be reversed from that shown in FIG. 1. Metallization 106, 108 may be applied to the rear and the front sides of the cell, respectively. Incoming light, represented by arrows 110, may pass through the front side of the solar cell upon which metallization lines 108 have been formed. The incoming light 110 enters the solar cell substrate 100 where charge generation occurs. In some applications, it may be desirable to provide a small line width W and a large metallization line spacing in order to reduce the shadowing effect of the front side metallization 108, while still allowing for sufficient coverage to adequately remove charge generated from the surface of the solar cell. It may also be desirable to provide metallization lines 108 with sufficient cross sectional area to adequately carry away charge generated by the cell. Thus, in some cases, it may be desirable to provide a small metallization line width W while providing a large metallization line height H, relative to prior known methods and applications.

The semiconductor substrate 100 may be pre-treated or conditioned before application of conductive ink used to form metallization lines 108. Examples of such pre-treatment or conditioning include making the surface more susceptible to adhesion by the conductive ink, cleaning the surface, applying an anti-reflective coating, applying a dielectric layer, altering the conductivity of the surface of the substrate, or performing any other form of pre-treatment or conditioning known to those skilled in the art.

Figure 2:
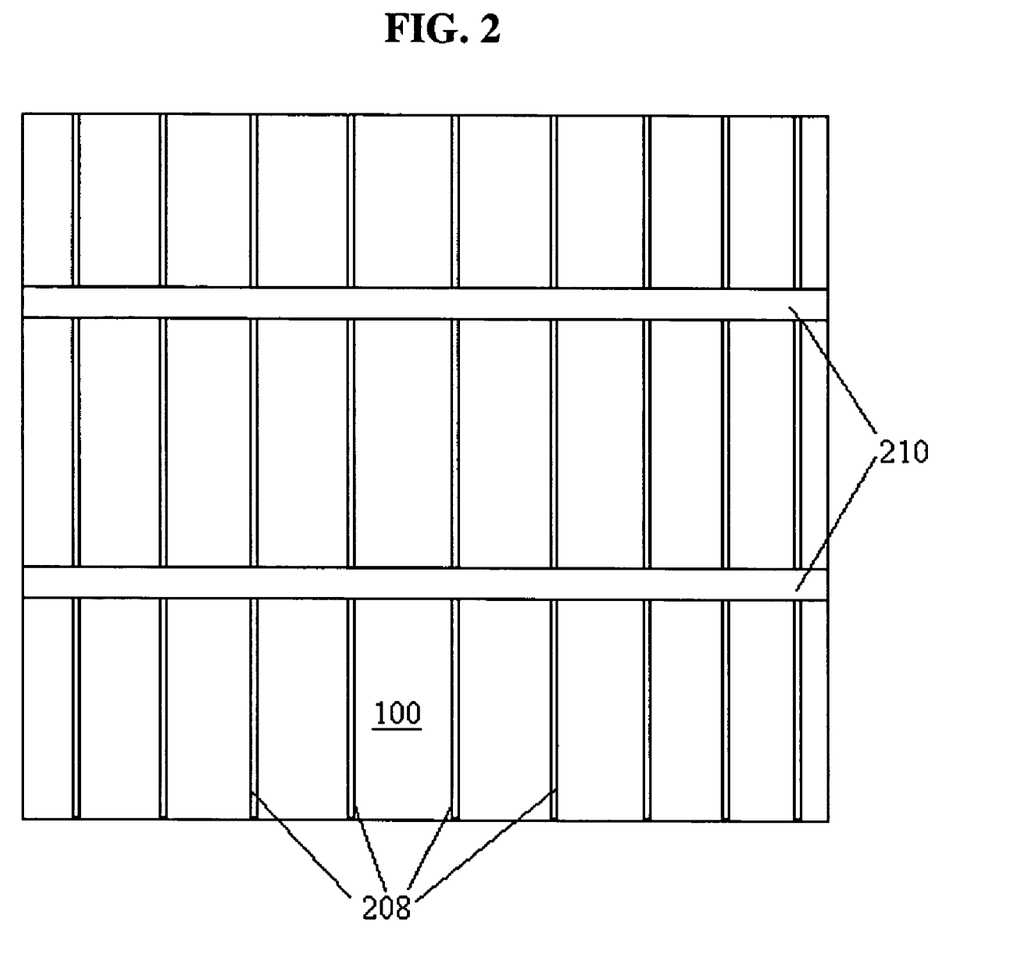
FIG. 2 is a plan view of a portion of a solar cell according to an embodiment disclosed herein.

FIG. 2 illustrates a plan view of portion of a solar cell that may be formed by an embodiment of this disclosure to illustrate a possible layout for a front side metallization. The front side metallization may comprise thinner finger lines 208 and somewhat thicker collector lines 210 to collect the charge from the finger lines 208. As shown in FIG. 2, lines 208, 210 are configured as a grid or matrix in which the thinner finger lines 208 intersect the thicker collector lines 210. Although a grid-like formation of metallization lines is illustrated in FIG. 2, alternate embodiments, including those formed by stencils configured and arranged to form different patterns with or without lines of differing dimensions should be understood as falling within the scope of this disclosure.

Figure 3:
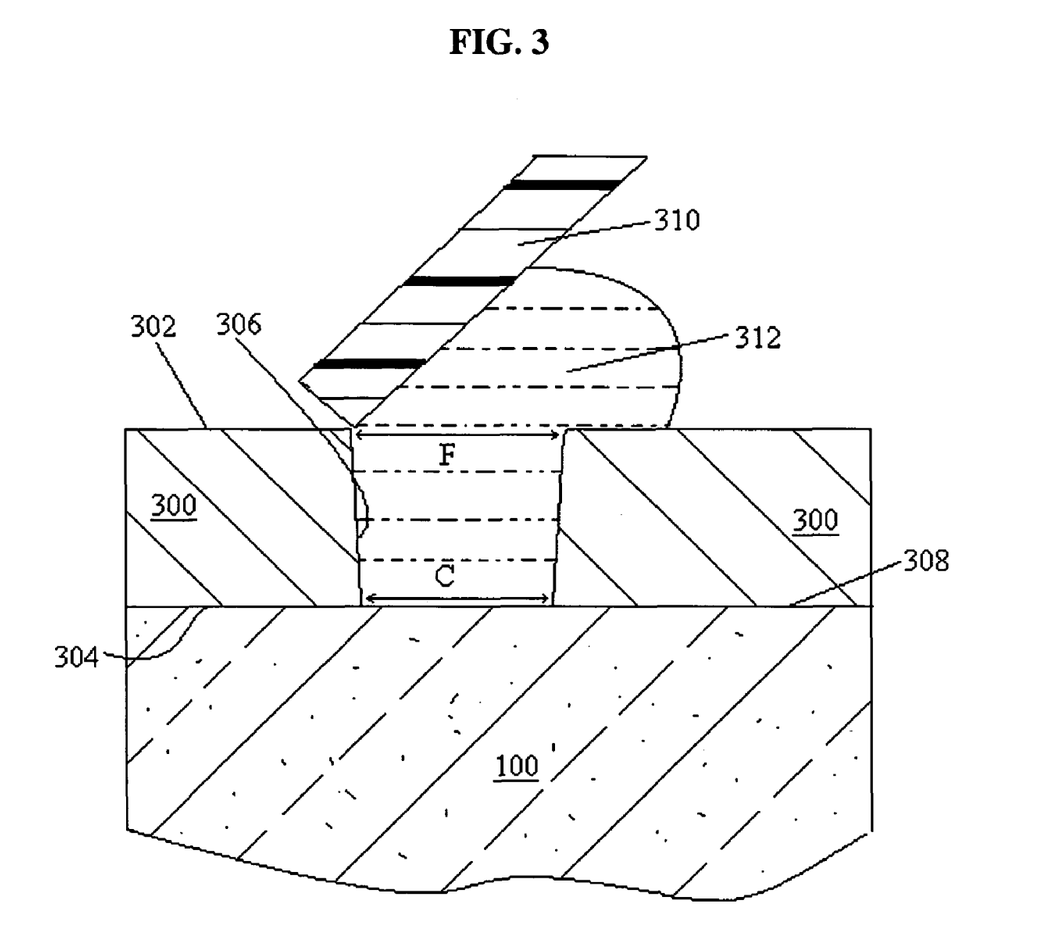
FIG. 3 is a cross section of a portion of a stencil according to one embodiment of this disclosure shown with a squeegee depositing a conductive ink onto a substrate.

FIG. 3 illustrates a portion of a stencil 300 according to an embodiment of this disclosure shown with a squeegee (or blade) 310 depositing a conductive ink 312 onto a substrate 100. In some embodiments, squeegee 310 may embody a rubber or plastic squeegee, and in some other embodiments, squeegee 310 may embody a metal blade or a plurality of rubber, plastic, or metal blades disposed either perpendicular to or at an angle with respect to the surface of the stencil. In the embodiment illustrated in FIG. 3, the stencil 300 has an aperture 306 with a cross-sectional area at the stencil/substrate interface 308 at the contact side 304 smaller than that at the fill side 302 of the stencil. In this two dimensional cross section view, widths F and C are correlated with the two dimensional areas of the aperture at the fill and contact sides of the stencil, respectively, with width F being greater than width C. Due to the exceptional flatness of the contact side 304 of stencil 300, and the sharpness of the edge formed by the walls of the aperture 306 and the contact side 304 of stencil 300, substantially no conductive ink is able to bleed out into the stencil/substrate interface 308.

Apertures 306 can be formed in the stencil by methods such as laser cutting, ferric chloride etching, electro-forming, or other methods known to those of skill in the art. The apertures may be formed by electroforming on mandrels, where the mandrels are created using a photolithographic process. The apertures may optionally be post-treated after fabrication by post-fabrication treatment methods, such as electro-polishing, electroplating, and/or coating with low-energy polymers. One technique for fabricating the stencil shall be discussed in greater detail below.

The apertures may taper at a constant slope from the fill side to the contact side of the stencil, or may taper at a variable slope, or not at all. The apertures may be in the form of straight lines cut through the stencil material or may be curved or of any shape appropriate for a particular application.

Figure 4:
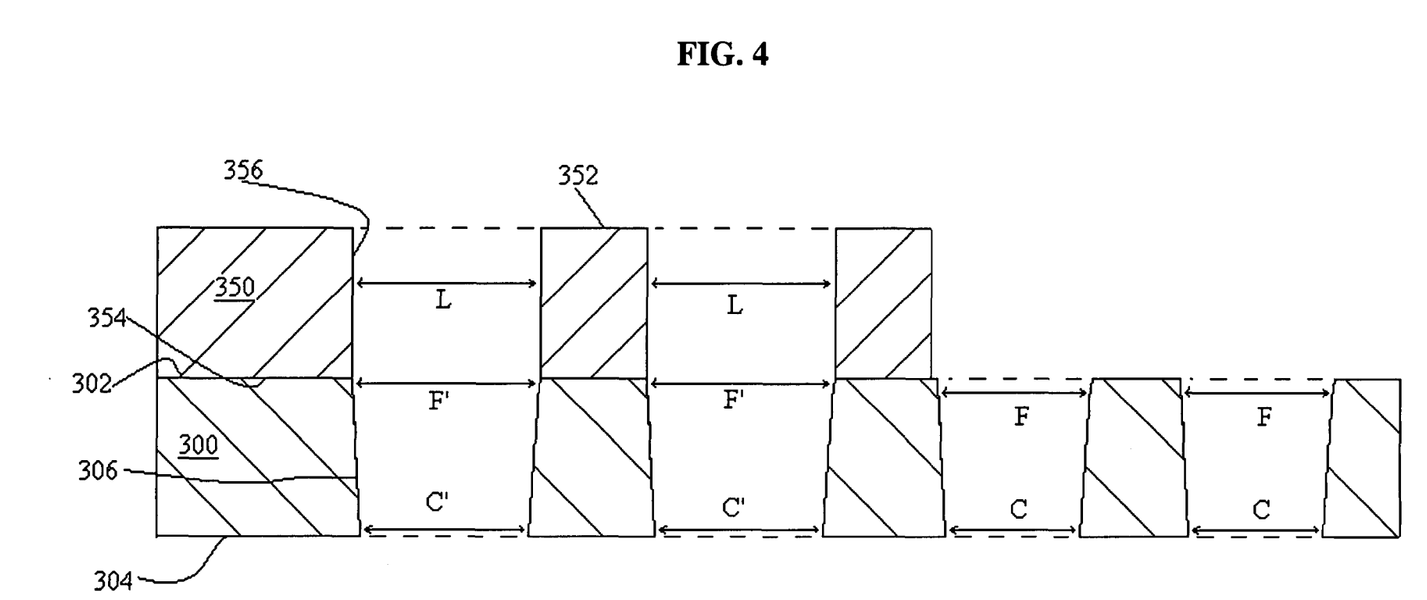
FIG. 4 is a cross section of a portion of a double layer stencil according to one embodiment of this disclosure.

FIG. 4 illustrates a double layer stencil according to an embodiment of this disclosure. Stencil layer 350, which may include upper surface 352, lower surface 354, and at least one aperture 356 contacts at least a portion of the surface of the fill side (the upper surface) 302 of stencil 300. Aperture 356 may be formed by processes including electroforming, laser cutting, or chemical etching. Stencil layer 350 may be joined to stencil 300 (referred to with reference to stencil layer 350 as stencil layer 300) along an interface between the surface of fill side 302 and surface 354 by techniques, such as lamination by means of an adhesive, e.g. epoxy, by anodic bonding, or by other joining techniques known in the art. Alternatively, stencil layer 350 may be electroformed on at least a portion of stencil layer 300.

Stencil layer 350 may have the same vertical thickness as stencil layer 300, or may be thicker or thinner than stencil layer 300. Stencil layer 350 may be formed of the same material or materials as stencil layer 300, or may be formed of a different material or materials. Stencil layer 350 may include the same aperture coating as stencil layer 300 if such a coating is present in stencil layer 300, or may include a different aperture coating, a coating not present in stencil layer 300, or no coating at all.

The opening of the aperture 356 at the lower surface 354 of stencil layer 350 may be at least partially aligned with the opening of the aperture 306 at the fill side (the upper surface) 302 of stencil layer 300. The size and shape of the opening of the aperture 356 at the lower surface 354 of stencil layer 350 may be substantially similar to the size and shape of the opening of the aperture 306 at the fill side 302 of stencil layer 300, although in some embodiments these openings may be of different sizes and/or shapes. A width L of aperture 356 at surface 354 may be greater or smaller than a width F' of aperture 306 at fill side 302. When multiple apertures 356 are present, they may have different sizes and shapes.

Aperture 356 may configured to have vertical sidewalls, which may be perpendicular to surfaces 352 and/or 354 as is illustrated in FIG. 4, or may have sidewalls that taper. The degree of taper of the sidewalls of aperture 356 may be the same or different than the degree of taper of a sidewall of one or more of apertures 306. The degree of taper of a sidewall of any of the apertures 356 may be different from that of another sidewall of the same aperture 356 or of a sidewall of another aperture 356.

As shown, stencil layer 350 may be configured so that stencil layer 300 extends beyond the periphery of stencil layer 350. Thus, apertures 306 that are present on some areas of stencil layer 300 may be exposed beyond the edge of stencil layer 350, and may have different dimensions, such as widths F and C, from dimensions, such as widths F' and C', of apertures 306, that are covered by stencil layer 350. In some embodiments, the overall volume of apertures 306 of stencil layer 300 in areas joined to stencil layer 350 may be greater than that of apertures 306 of stencil layer 300 in areas not joined to stencil layer 350. This may facilitate the printing of lines of conductive ink of different heights and/or widths, such as for example, finger lines 208 and collector lines 210 of a solar cell 100, during a single printing operation.

Although two stencil layers are illustrated in the dual-layer stencil of FIG. 4, further embodiments may include multilayer stencils with greater than two stencil layers.

Figure 5:
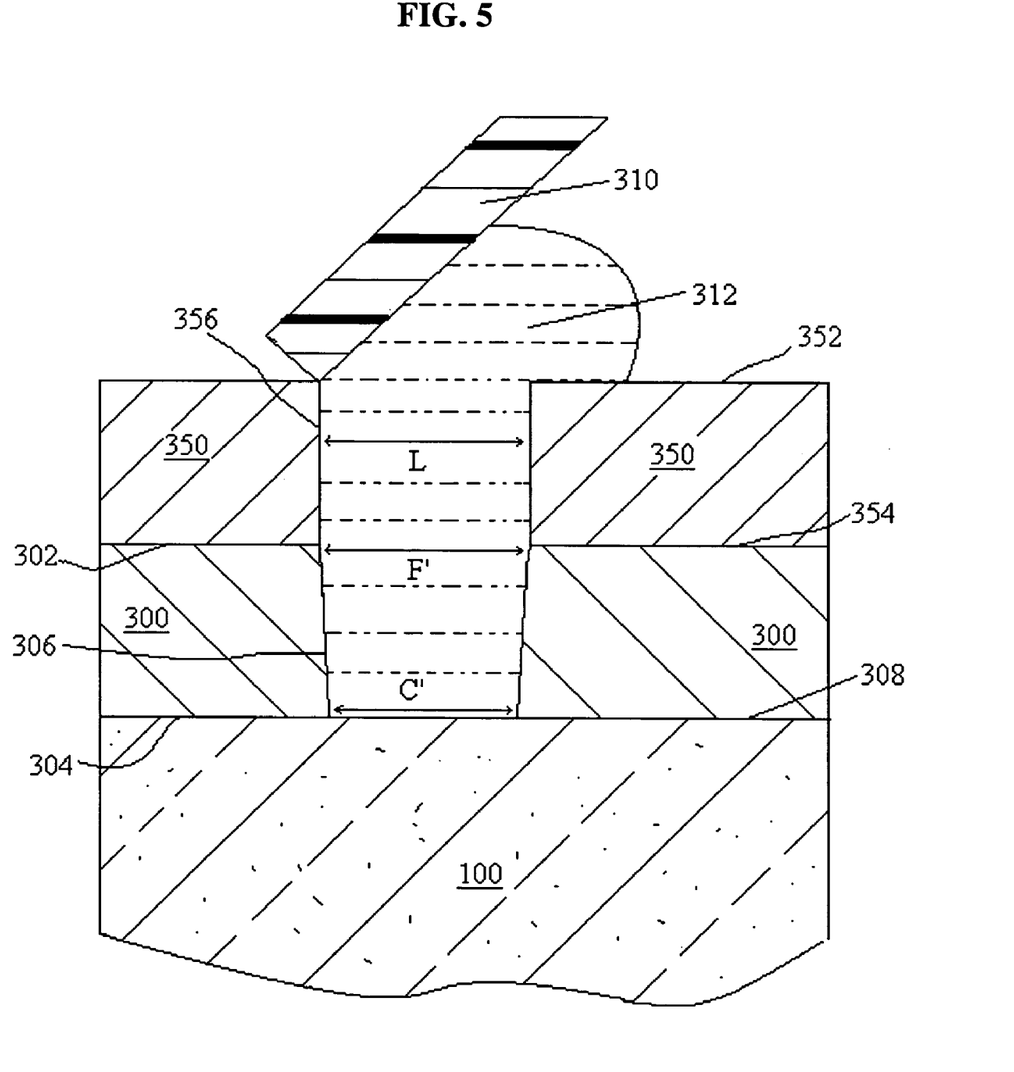
FIG. 5 is a cross section of a portion of a double layer stencil according to one embodiment of this disclosure shown with a squeegee depositing a conductive ink onto a substrate.

FIG. 5 is a view that is similar to FIG. 3 and illustrates how conductive ink 312 may be printed through a portion of a double layer stencil comprised of stencil layer 300 and stencil layer 350. A squeegee (or blade) 310 may deposit a conductive ink 312 through an aperture 356 of stencil layer 350 and an aperture 306 of stencil layer 300 onto a substrate 100. The double layer stencil comprised of stencil layer 300 and stencil layer 350 may be separated from substrate 100, leaving a pattern of conductive ink. In some embodiments, stencil layer 350 may be joined to stencil layer 300 with no gaps in the interface between stencil layers 350 and 300 for conductive ink to bleed into.

Figure 6:
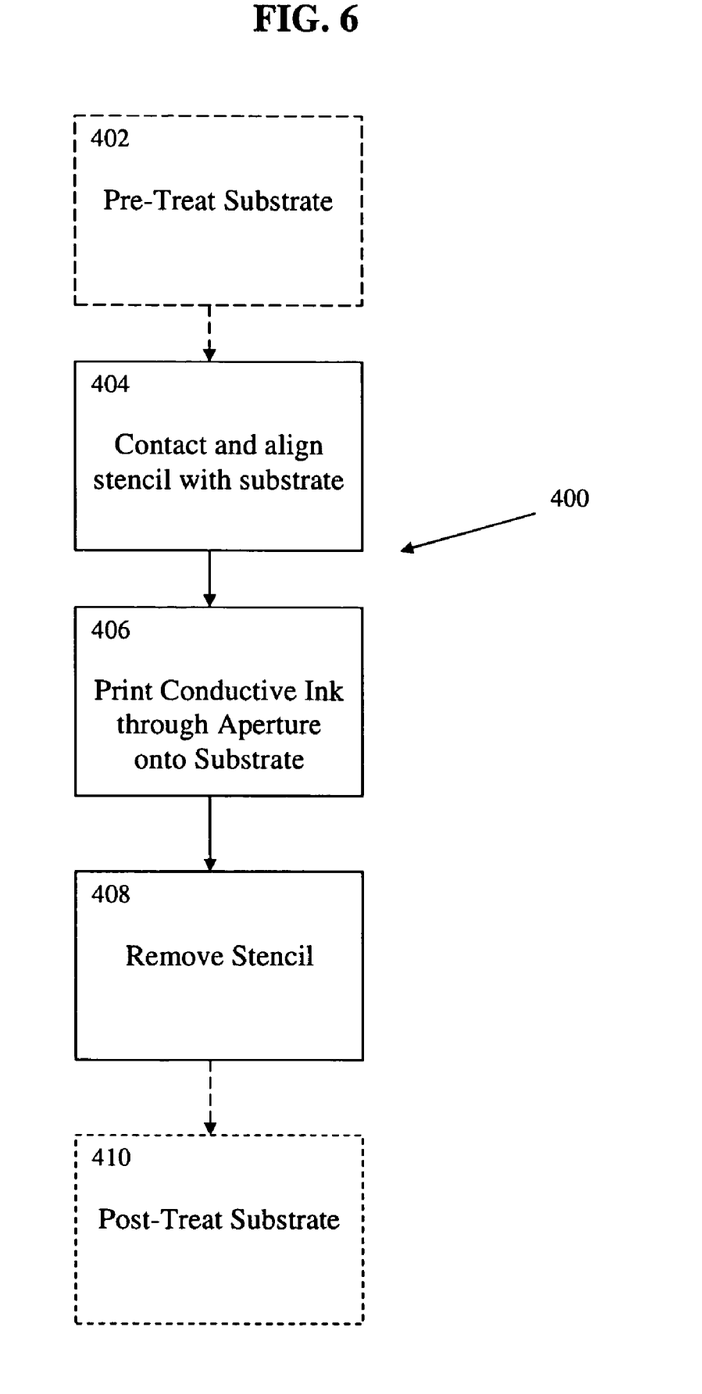
FIG. 6 is a flow chart of a method according to an embodiment of this disclosure.

FIG. 6 illustrates a simplified flow chart 400 of one method of providing metallization onto a semiconductor substrate according to this disclosure. In optional step 402, a substrate upon which metallization lines are to be printed may be pre-treated using any of various pre-treatment methods known in the art, for example, cleansing the substrate surface or applying a coating to enhance conductive ink adhesion. In step 404, a stencil containing one or more apertures is brought into contact and aligned with the substrate so that the one or more apertures are aligned with an area or areas of the substrate where it is desired to deposit conductive ink to form metallization lines. The stencil may be held in place against the substrate by any of the stencil frames or positioning devices known in the art or by modified versions thereof. In step 406, conductive ink may be printed through the apertures in the stencil by applying conductive ink to the fill side surface of the stencil and pushing the conductive ink through the apertures using a squeegee, a blade or blades, a material dispensing head, or other device known to those of skill in the art of stencil printing. A single- or a multi-layer stencil may be employed.

In certain embodiments, the conductive ink may be printed at room temperature or at elevated or reduced temperatures according to the requirements of the particular application. In some embodiments, the conductive ink makes contact with the substrate and may adhere to the substrate. The stencil may be removed, leaving the conductive ink on the substrate in a pattern defined by the aperture or apertures. Subsequent heating may be used to cure the lines, solidify the ink, or promote adhesion to the substrate in optional post treatment step 410. Such heating may occur prior to removal of the stencil in some applications. Post treatment step 410 may also include any number of other post treatment operations known to those of skill in the art, such as, for example, coating the substrate with a protective or anti-reflective coating. It should be understood that flowchart 400 is simplified and in actual practice the method described may contain additional steps or the steps described may be performed in a different sequence.

Figure 7A:
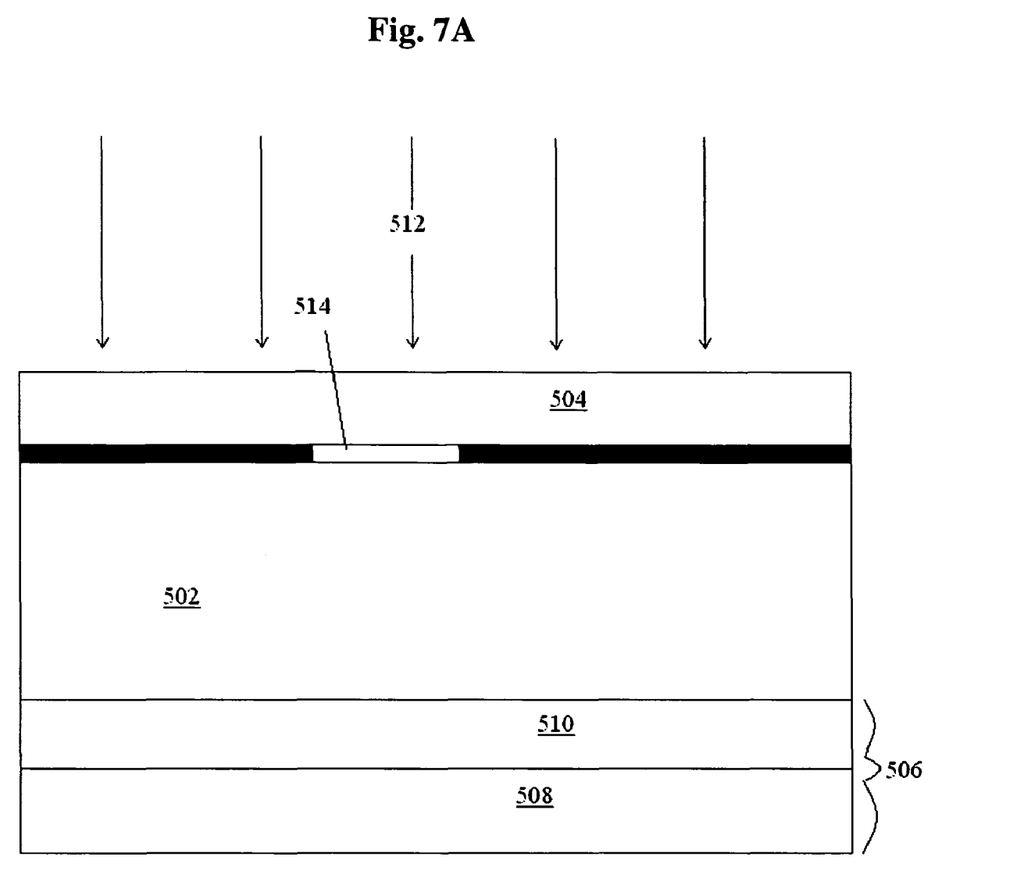
FIG. 7A illustrates a method of forming a stencil for use in substrate metallization.
Figure 7B:
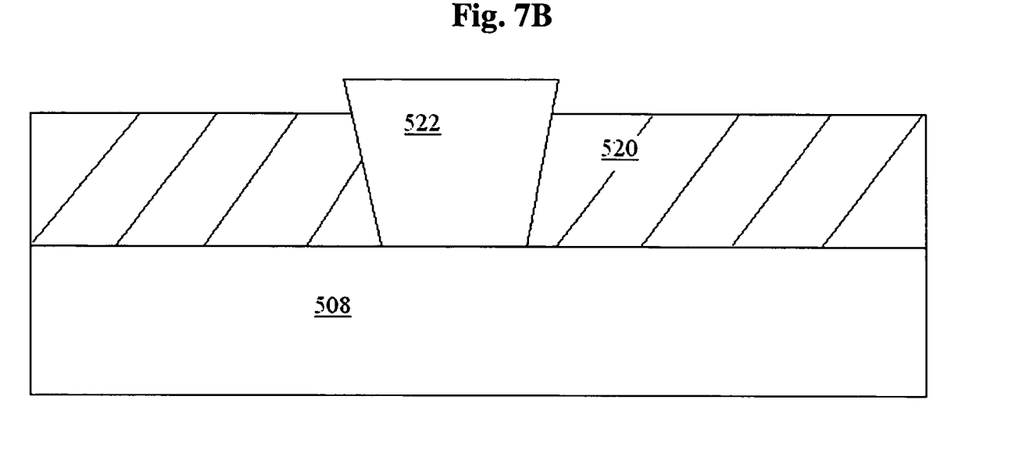
FIG. 7B illustrates a further step in the method shown in FIG. 7A.

FIGS. 7A and 7B illustrate a method of forming apertures in a stencil for use in forming metallization lines on a substrate. In one method according to this disclosure, illustrated in FIG. 7A, an optical separator 502 is introduced between a photolithography mask 504 and a photosensitive plate 506 consisting of base plate 508 and photoresist layer 510. The photolithography mask 504 has an area 514 which is transparent to ultraviolet (UV) light. In some embodiments, the photoresist layer 510 may be composed of positive photoresist, and, in others, may be composed of negative photoresist. The separator 502 may be a thin, flat plate, and can be made of glass, air, polyester, or any other material transparent to UV light, and can have thickness anywhere between ten micrometers and one millimeter. UV light beams, illustrated by arrows 512, are used to image area 514, and can be collimated or non-collimated. Exposing thick photoresist layers 510 (on the order of 100 micrometers thick, preferably between 50 and 150 micrometers thick) according to this method results in an image characterized by a prominent taper. At the top surface of the photoresist layer 510, the area of exposed photoresist is greater than that at the bottom surface of photoresist layer 510. The width of the area of exposed photoresist tapers from the top surface to the bottom surface. This tapering effect is caused by refraction of the non-perpendicular portion of the light in the optical separator.

After development, non-cross-linked photoresist is washed off the base plate 508, and after plating a metal layer around remaining cross-linked photoresist 522, a metal stencil 520 is produced with an inverse trapezoidal-shaped aperture as is shown in FIG. 7B. To finish the stencil, the photoresist 522 may be stripped from the apertures, and the stencil 520 separated from the base plate 508.

Stencils formed in the manner described may have exceptionally flat bottom surfaces and exceptionally sharp edges between aperture walls and stencil surfaces at the corners of the bottom of apertures and the stencil bottom. These stencils may be used to print conductive ink onto semiconductor substrates without significant bleedout.

The angle of the walls of the apertures formed depends on a number of factors including the type of photoresist, the degree of collimation of the light, the thickness of the optical separator, and its refractive index. Variation of these parameters makes it possible to produce a variety of angles, and thus one can optimize the aperture design for a particular application.

EXAMPLES

Baseline Tests

Tests were performed on laser cut stainless steel stencils with various dimensions, including 70 and 90 micrometer wide openings in 70 micrometer thick sheets. Two layouts were tested, one with and one without a busbar included. The busbar was in the form of a two mm wide opening connecting all of the fingers. Both layouts had, in total, 52 parallel lines.

The laser cut of the apertures varied in width, with wider and narrower areas. Some openings were sometimes as narrow as 35 micrometers, in which printing was feasible. The laser cut was relatively rough, most likely causing observed darker spots in the print due to difficulties with paste release. The design incorporating the busbar was impossible to print due to paste drop-out. The lines at the cell extremities were much wider than those near the center. Line thickness was acceptable; about 60 micrometers high when dried.

Testing was also performed on electroformed nickel stencils. Larger screens (15-inch screens) instead of smaller screens (12-inch screens) were used to allow for larger snap-off printing. The printing test was performed with 80-micrometer wide openings formed in a 60-micrometer thick sheet. To resolve the limitations with printing at the extremity, extra lines outside the print area were included.

Paste release was acceptable, but bleeding was immense (130-150 micrometer wide fingers were observed). This was found to be related to the stencil manufacturing. An overgrowth technique was used which resulted in very unsharp edges. The extremity issue was resolved, especially at higher snap-off values. Line resistivity was acceptable, but the number of fingers was too small.

Tests Using Disclosed Stencils

Four 60-micrometer thick electroformed nickel stencils (hard nickel) from Fry's Metals, Inc., of Jersey City, N.J., also known as Cookson Electronic Assembly Materials, were supplied. Two stencils were provided with normal taper. Two stencils were provided with reverse taper. Two stencils, one normal taper and one reverse taper, were provided with 80-micrometer wide openings and two stencils, one normal taper and one reverse taper, with 60-micrometer wide openings were provided. Unmodified production metallization ink was utilized for all tests. Both a red (soft rubber) and a nickel metal squeegee were tested.

Three of the stencils were tested: both normal and reverse taper versions of the 80 micrometer stencils and the normal taper version of the 60 micrometer stencils.

Figure 8:
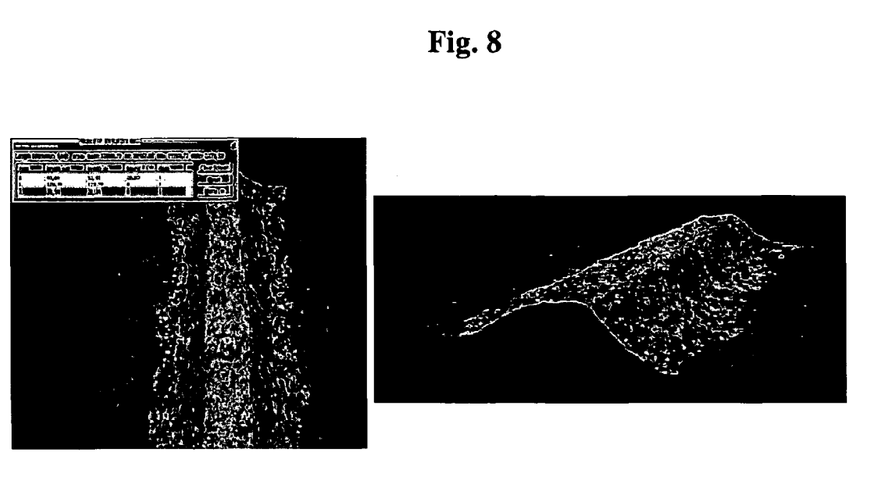
FIG. 8 is a photomicrograph of a metallization line formed utilizing a normal taper stencil with 80 micrometer wide apertures.

For the 80 micrometer normal taper stencil, paste release was acceptable at a snap-off of two mm. Lines at the cell extremities were somewhat broader than those in the center of the cell. Overall line width was between 120 and 130 micrometers. Issues with bleeding were observed, increasing with squeegee pressure. The line thickness was measured to be about 28 micrometer when cured. The photomicrographs illustrated in FIG. 8 were taken.

Figure 9:
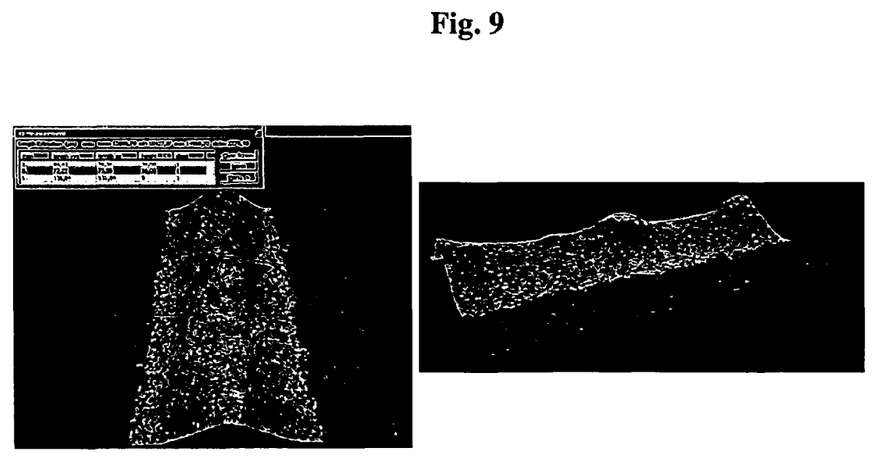
FIG. 9 is a photomicrograph of a standard screen printed metallization line.

For comparison: in FIG. 9 is illustrates a standard screen-printed metallization line (130 micrometer wide, 14-26 micrometer high). A standard emulsion screen was used to print the line illustrated in this figure.

For the 60 micrometer normal taper stencil, constant blocking of the stencil was observed.

Figure 10:
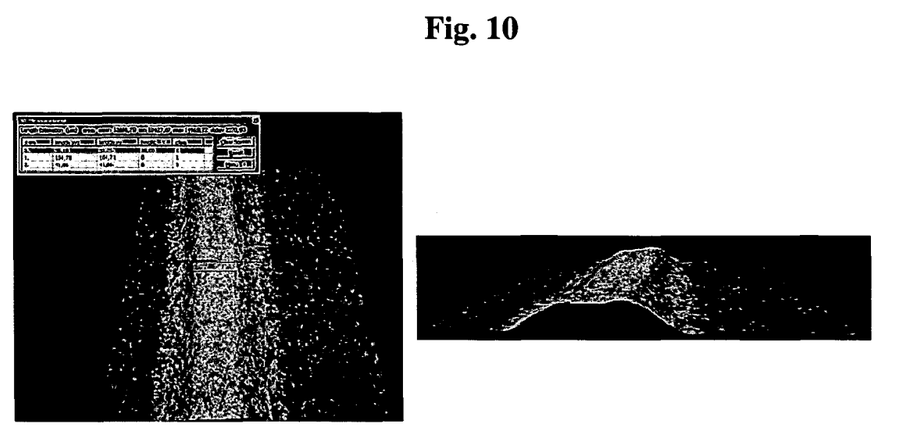
FIG. 10 is a photomicrograph of a metallization line formed utilizing a reverse taper stencil with 80 micrometer wide apertures.

For the 80 micrometer reverse taper stencil, paste release acceptable at a snap-off of 2.2 mm. The metal squeegee was found to be ineffective when working with snap-off. The red rubber squeegee gave the best results. Lines at the cell extremities were somewhat broader than those in the center of the cell. Overall line width was observed to be about 100 micrometers. There was no problem with bleeding (even at high squeegee pressures). The line thickness was about 16 micrometer when cured. A photomicrograph of one metallization line observed is illustrated in FIG. 10. The printing conditions were as follows: red squeegee, 2.2 mm snap-off, 50 N squeegee pressure, 150 mm/s print speed.

The 60 micrometer reverse taper stencil was not tested.

TABLE 1.1

Solar Cell Parameters (averages)

| | Voc (mV) | Isc (A) | Rs (mOhm) | Rsh (Ohm) | FF (%) | Eff (%) |
|---|---|---|---|---|---|---|
| 80 micrometer reverse taper | 0.612 | 8.057 | 3.9 | 39.31 | 76.59 | 15.53 |
| 80 micrometer normal taper | 0.610 | 7.978 | 3.5 | 44.40 | 77.12 | 15.43 |

As shown in Table 1.1, the solar cell characteristics appear to coincide with the conclusions from the print evaluation. Due to low shadowing losses, high currents were observed for the reverse taper stencil (e.g., greater than 8 A). Solar cells made from the reverse taper stencil provided higher series resistance values (Rs) than the solar cells made from the normal taper stencil. This result can be explained from the observed higher paste volume deposited with the normal taper stencil (wider and higher print).

The 80-micrometer aperture width reverse taper stencil provides enhanced results. The application of a print operation incorporating the 80 micrometer aperture width reverse taper stencil resulted in 100 micrometer wide lines. Almost no bleeding was observed, even at higher squeegee pressures. The solar cells made with this stencil provided high currents due to low shadowing losses (e.g., greater than 8 A). Line resistance values of the fingers were in the same range as standard screenprinted solar cells (250 mOhm/cm vs 240 mOhm/cm for standard print).

Stencil Formation Examples

A stencil having standard openings, characterized by an opening width at the contact side of the stencil greater than that at the fill side of the stencil, was fabricated by electroforming. A photoresist thickness of 75 micrometers, and an exposure energy of 150 mJ/cm2 were utilized, resulting in a stencil with a thickness of 60 micrometers, with contact side openings of 80 micrometers, and a taper angle of about 6 degrees. Printing of metallization lines on silicon wafers was performed with a snap-off of 2 mm, 150 mm/s print speed, and standard conductive ink. The resulting line width after printing was 120-140 micrometers, with irregular edges.

A second stencil having reverse tapered (funnel shaped) apertures was made by electroforming. A resist thickness 75 micrometers, and an exposure energy 150 mJ/cm2 were utilized, resulting in a stencil thickness of 60 micrometers, with 80 micrometer wide contact side openings, and a taper angle about 6 degrees. Printing of the metallization lines on silicon wafers was done under similar conditions as in the example above. After printing, the line width was 100 micrometers, with straight edges.

A third stencil, having reverse tapered (funnel-shaped) apertures with tapered walls, was fabricated by electroforming. Imaging was done using a optical separator with a thickness of 175 micrometers, and with an exposure energy of 250 mJ/cm2. The resulting stencil displayed apertures with a taper angle of about 15 degrees.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method for providing metallization upon a semiconductor substrate, the method comprising:

providing a semiconductor substrate having a surface suitable for printing;

placing a stencil having a contact side, a fill side, and at least one aperture extending from the contact side to the fill side over the semiconductor substrate with the contact side of the stencil in contact with the semiconductor substrate, the contact side of the stencil being substantially flat and forming a sharp edge with a wall of the at least one aperture, a cross-section of the at least one aperture at the contact side having a predetermined width, and the at least one aperture being tapered such that an area of a cross-section of the at least one aperture at the fill side is larger than an area of the cross-section of the at least one aperture at the contact side; and printing conductive ink through the at least one aperture and onto the semiconductor substrate, the conductive ink being printed in direct contact with the semiconductor substrate.

2. A method for providing metallization upon a semiconductor substrate, the method comprising:

providing a semiconductor substrate having a surface suitable for printing;

placing a stencil having a contact side, a fill side, and at least one aperture extending from the contact side to the fill side over the semiconductor substrate with the contact side of the stencil in contact with the semiconductor substrate, the contact side of the stencil being substantially flat and forming a sharp edge with a wall of the at least one aperture, a cross-section of the at least one aperture at the contact side having a predetermined width, and the at least one aperture being tapered such that an area of a cross-section of the at least one aperture at the fill side is larger than an area of the cross-section of the at least one aperture at the contact side;

printing conductive ink through the at least one aperture and directly onto the semiconductor substrate; and removing the stencil, wherein after removal of the stencil, the conductive ink adheres to the semiconductor substrate without significant bleedout, such that at least one line of conductive ink has substantially straight edges, and wherein a height to width aspect ratio of the at least one line of conductive ink is greater than about 1:10 after heating and cooling.

3. The method of claim 1, wherein the semiconductor substrate comprises silicon.

4. The method of claim 1, wherein the surface of the semiconductor substrate comprises a surface of a photovoltaic device.

5. The method of claim 1, wherein the conductive ink comprises silver-based ink.

6. The method of claim 1, wherein the conductive ink has a Malcolm viscosity of less than about Mx 30.

7. The method of claim 1, wherein the conductive ink has a Malcolm viscosity of less than about Mx 15.

8. The method of claim 1, wherein the conductive ink has a Malcolm viscosity in the range of from about Mx 05 to about Mx 10.

9. The method of claim 1, wherein the conductive ink has a viscosity of between about 160 Pa·s and about 260 Pa·s as measured on a Brookfield HBT viscometer (Utility Cup and Spindle) tested at 10 RPM at 25° Celsius.

10. The method of claim 1, wherein the conductive ink has a viscosity of less than about 140 Pa·s as measured on a Brookfield model HBT cone/plate viscometer tested at 9.6 reciprocal seconds using a 1.565" cone at 25° Celsius.

11. The method of claim 1, wherein the conductive ink has a viscosity of between about 70 Pa·s and 110 Pa·s as measured on a Brookfield model HBT cone/plate viscometer tested at 9.6 reciprocal seconds using a 1.565" cone at 25° Celsius.

12. The method of claim 1, wherein the conductive ink has a resistivity of less than about $15 \times 10^{-6}$ ohm·cm at room temperature.

13. The method of claim 1, further comprising aligning the stencil with the semiconductor substrate.

14. The method of claim 1, further comprising removing the stencil, while leaving the conductive ink substantially adhered to the semiconductor substrate.

15. The method of claim 1, wherein the conductive ink is at about room temperature when passing through the stencil.

16. The method of claim 1, wherein the at least one aperture gradually tapers from the fill side to the contact side of the stencil.

17. The method of claim 1, wherein the conductive ink is forced through the at least one aperture and onto the semiconductor substrate with a squeegee.

18. The method of claim 1, wherein the conductive ink is forced through the at least one aperture and onto the semiconductor substrate with a material dispensing head.

19. The method of claim 1, wherein the stencil has a thickness in the range from about 0.025 mm to about 0.2 mm thick.

20. The method of claim 1, wherein the stencil is a multilayer stencil.

21. The method of claim 1, wherein at least one aperture is formed in the stencil by laser cutting.

22. The method of claim 12, wherein the conductive ink has a resistivity in the range of from about $1.6 \times 10^{-6}$ to about $10 \times 10^{-6}$ ohm·cm at room temperature.

23. The method of claim 14, wherein the conductive ink adheres to the semiconductor substrate without significant bleedout, such that at least one line of conductive ink has substantially straight edges.

24. The method of claim 14, wherein the conductive ink is at about room temperature when the stencil is removed.

25. The method of claim 19, wherein the at least one aperture has a width of about 0.005 mm to about 0.15 mm at the contact side of the stencil.

26. The method of claim 20, wherein a conductive finger and a conductive busbar are deposited on the semiconductor substrate in one print step, a length dimension of the conductive busbar being non-parallel to a length dimension of the conductive finger, the conductive busbar having at least one of a greater thickness and a greater height than the conductive finger.

27. The method of claim 21, wherein the stencil is a multilayer stencil, at least one layer including at least one aperture formed by laser cutting.

28. The method of claim 22, wherein the conductive ink has a resistivity in the range of from about $2 \times 10^{-6}$ to about $8 \times 10^{-6}$ ohm·cm at room temperature.

29. The method of claim 23, further comprising heating the at least one line of conductive ink after printing, wherein a secure mechanical and electrical coupling between the at least one line of conductive ink and the semiconductor substrate is formed.

30. The method of claim 29, wherein a height to width aspect ratio of the at least one line of conductive ink is greater than about 1:10 after heating and cooling.

31. The method of claim 2, wherein the at least one aperture has a width of about 0.005 mm to about 0.095 mm at the contact side of the stencil.

* * * * *